(12) United States Patent
Takaishi (10) Patent No.: US 6,239,001 B1
(45) Date of Patent: *May 29, 2001

(54) METHOD FOR MAKING A SEMICONDUCTOR DEVICE

(75) Inventor: Yoshihiro Takaishi, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/005,739

(22) Filed: Jan. 12, 1998

(30) Foreign Application Priority Data

Jan. 10, 1997 (JP) .................................... 9-002735

(51) Int. Cl.[7] .................................... H01L 21/76
(52) U.S. Cl. .......................... 438/431; 438/439; 438/443
(58) Field of Search .................. 438/424, 440, 438/448, 439, 441, 431, 404, 405, 425; 257/506

(56) References Cited

U.S. PATENT DOCUMENTS

| | | | |
|---|---|---|---|
| 4,506,434 | * 3/1985 | Ogawa et al. | 438/424 |
| 4,630,356 | * 12/1986 | Christie et al. | 438/444 |
| 5,358,894 | * 10/1994 | Fazan et al. | 438/440 |
| 5,360,753 | * 11/1994 | Park et al. | 438/421 |
| 5,369,051 | * 11/1994 | Rao et al. | 438/448 |
| 5,506,440 | * 4/1996 | Wei et al. | 257/506 |
| 5,554,256 | * 9/1996 | Pruijmboom et al. | 438/424 |
| 5,763,317 | * 6/1998 | Lee et al. | 438/448 |
| 5,804,493 | * 9/1998 | Juang | 438/440 |

FOREIGN PATENT DOCUMENTS

| | | |
|---|---|---|
| 59-115538 | 1/1984 | (JP) . |
| 2-132830 | 5/1990 | (JP) . |
| 4-155829 | 5/1992 | (JP) . |
| 4-303942 | 10/1992 | (JP) . |
| 4-360532 | 12/1992 | (JP) . |
| 6-326089 | 11/1994 | (JP) . |

OTHER PUBLICATIONS

Shimizu, N., "A Poly–Buffer Recessed LOCOS Process for 256Mbit DRAM Cells", *IEDM 92–279*, Semiconductor Research Center, Japan, 1992 IEEE, 10.6.1–10.6.4.

Toshio Kobayashi et al., Nitrogen In–Situ Doped Poly Buffer LOCOS:Simple and Scalable Isolation Technology for Depp–Submicron Silicon Devices,IEEE on Electron Devcies, pp 311–317, Feb. 1996.*

T. Park et al., Self–Aligned LOCOS/Trench (SALOT) Combination Isolation Technology Planarized by Chemical Mechanical Polishing, IDEM, IEEE, Dec. 1994 pp 675–678.*

* cited by examiner

*Primary Examiner*—Olik Chaudhuri
*Assistant Examiner*—Wiliam David Coleman
(74) *Attorney, Agent, or Firm*—Hutchins, Wheeler & Dittmar (57) ABSTRACT

Disclosed is a method for making a semiconductor device where a device region and a device isolation region for electrically isolating between devices are formed on a semiconductor substrate, said device region including a transistor, which has the steps of: forming device isolation film by using polysilicon film or amorphous silicon film as a buffer; and oxidizing the polysilicon film or amorphous film into silicon oxide film and then removing the silicon oxide film after forming the device isolation film.

32 Claims, 9 Drawing Sheets

METHOD FOR MAKING A SEMICONDUCTOR DEVICE

FIELD OF THE INVENTION

This invention relates to a method for making a semiconductor device, and more particularly to, a method for making a semiconductor device where a device region and an isolation region for electrically isolating between devices are formed on a semiconductor substrate.

BACKGROUND OF THE INVENTION

Semiconductor devices, such as a transistor, wiring and contact, used to compose an integrated circuit have been needed to be finer with an increase in integration density of integrated circuits. Also, a device isolation width for isolating between devices has been needed to be narrower.

LOCOS process has been generally used to isolate between semiconductor devices. In LOCOS process, bird's beak encroachment may occur during field oxidation. Due to the bird's beak encroachment, the dimensions of device isolation width and device width become difficult to control. Under the circumstances, pad oxide film formed under nitride film is thinned to reduce the bird's beak encroachment of the pad oxide film so as to obtain a fine device.

However, finer device isolation becomes difficult to realize since leakage current is increased by a stress applied to a substrate during oxidation due to bird's beak size and thinned pad oxide film.

Poly-buffer LOCOS process, where polysilicon film is inserted between nitride film and pad oxide film, has been proposed to solve this problem. By inserting the polysilicon film, the bird's beak encroachment can be reduced to relieve the stress applied to the substrate.

N. Shimizu et al., "A Poly-Buffer Recessed LOCOS for 256 Mbit DRAM Cells", IEDM92, pp.279–282, 1992 suggests a poly-buffer recessed LOCOS process, which is a modified poly-buffer LOCOS process, as a device isolation method applicable to 256 Mbit or more DRAM with a device isolation width of around 0.25 $\mu$m.

The polysilicon film used to relieve the stress needs to be removed with the nitride film after the field oxidation so as to form a transistor, diffusion layer etc. Also, the polysilicon film and the pad oxide film formed thereunder need to be further thinned to realize a finer device isolation width. In general, it is known that there occurs a void in the buffer polysilicon film itself while it serves to relieve the stress to the substrate. In particular, the void occurs around the edge of pattern where the bird's beak extends.

Around this void, the pad oxide film located under the polysilicon film may be also etched when the nitride film is removed by etching. In this state, when the polysilicon film is etched, the substrate may be holed since the void occurring portion does not have the pad oxide film or the pad oxide film is thinned. This is because the substrate is of monocrystalline silicon that has little etch selectivity to the polysilicon film.

When the substrate is holed, the leakage current and resistivity are increased, and therefore the characteristics are reduced or dispersed not to meet the device characteristics required. Further, even if it meets the device characteristics, the aesthetic appearance of the active region is thereby deteriorated.

Also, a method of doping nitrogen into polysilicon film so as to prevent the void from occurring in the buffer polysilicon film is proposed in IEDM94. However, when the void is decreased, the function to relieve the stress is reduced. Further, an additional apparatus to dope nitrogen into the polysilicon film is required.

SUMMARY OF THE INVENTION

Accordingly, it is an object of the invention to provide a method for making a semiconductor device where the deterioration of electrical property can be prevented while employing polysilicon buffer LOCOS process to give finer device isolation to the device.

According to the invention, a method for making a semiconductor device where a device region and a device isolation region for electrically isolating between devices are formed on a semiconductor substrate, the device region including a transistor, comprises the steps of:

forming device isolation film by using polysilicon film or amorphous silicon film as a buffer; and oxidizing the polysilicon film or amorphous film into silicon oxide film and then removing the silicon oxide film after forming the device isolation film.

According to another aspect of the invention, a method for making a semiconductor device where a device region and a device isolation region for electrically isolating between devices are formed on a semiconductor substrate, the device region including a transistor, comprises the steps of:

forming sequentially first oxide film, polysilicon film and silicon nitride film on the semiconductor substrate;

removing completely the silicon nitride film, the polysilicon film and the first oxide film corresponding to where the device isolation region is formed by etching, and removing part of the semiconductor substrate corresponding to where the device isolation region is formed by etching;

field-oxidizing the etched part of the semiconductor substrate to form field oxide film;

removing the silicon nitride film by etching; and oxidizing the polysilicon film to form second oxide film and then removing the first and second oxide film over the device region.

According to another aspect of the invention, a method for making a semiconductor device where a device region and a device isolation region for electrically isolating between devices are formed on a semiconductor substrate, the device region including a transistor, comprises the steps of:

forming sequentially first oxide film, polysilicon film and silicon nitride film on the semiconductor substrate;

removing completely the silicon nitride film corresponding to where the device isolation region is formed by etching, and removing part of the polysilicon film corresponding to where the device isolation region is formed by etching;

field-oxidizing the etched part of the polysilicon film to form field oxide film;

removing the silicon nitride film by etching; and oxidizing the polysilicon film to form second oxide film and then removing the first and second oxide film over the device region.

According to another aspect of the invention, a method for making a semiconductor device where a device region and a device isolation region for electrically isolating between devices are formed on a semiconductor substrate, the device region including a transistor, comprises the steps of:

forming sequentially first oxide film, polysilicon film and silicon nitride film on the semiconductor substrate;

removing completely the silicon nitride film, the polysilicon film and the first oxide film corresponding to where the device isolation region is formed by etching and removing part of the semiconductor substrate corresponding to where the device isolation region is formed by etching so as to form a groove on the semiconductor substrate;

oxidizing sidewall of the groove and part of the polysilicon film and then burying the groove with burying oxide film to form field oxide film;

removing the silicon nitride film by etching; and oxidizing the polysilicon film to form second oxide film and then removing the first and second oxide film over the device region.

In this invention, the polysilicon film or amorphous silicon film is first oxidized into silicon oxide film and thereafter the obtained silicon oxide film is removed, when the polysilicon film or amorphous silicon film on the base silicon substrate is removed. The silicon oxide film has a high etch selectivity to the silicon substrate. Therefore, the base substrate can be formed not roughed by etching. Thus, LOCOS device isolation process can be conducted giving finer device isolation. Also, the dispersion of device can be reduced, thereby enhancing the reliability and production yield.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a method for making a semiconductor device in the preferred embodiment, the aforementioned conventional method will be explained below.

Figure 1A:
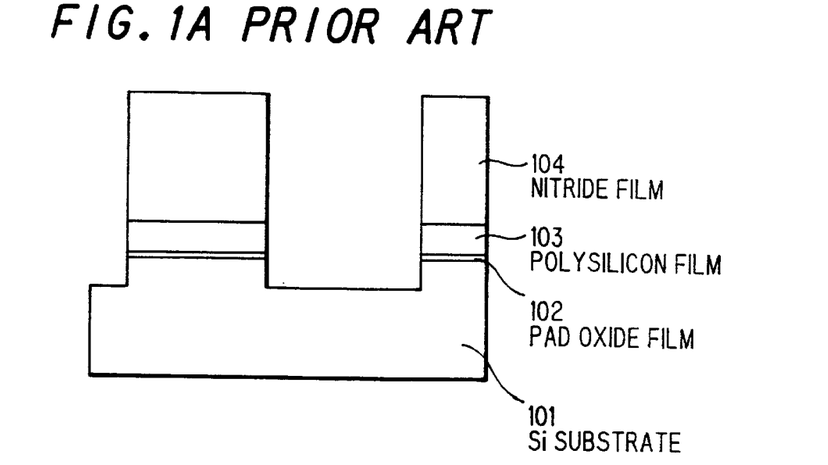
FIGS. 1A to 1C are cross sectional views showing a conventional method for making a semiconductor device.

A method for forming field isolation oxide film by using the poly-buffer recessed LOCOS process will be explained in FIGS. 1A to 1C. As shown in FIG. 1A, 10 nm thick pad oxide film 102, 50 nm thick polysilicon film 103 and 200 nm thick nitride film 104 are on a silicon substrate 101. Then, a resist pattern (not shown) is formed by photolithography, and then the nitride film 104, polysilicon film 103, pad oxide film 102 and silicon substrate 101 are etched by using the resist as a mask. Here, the etching depth for the silicon substrate 101 is about 25 to 200 nm.

Figure 1B:
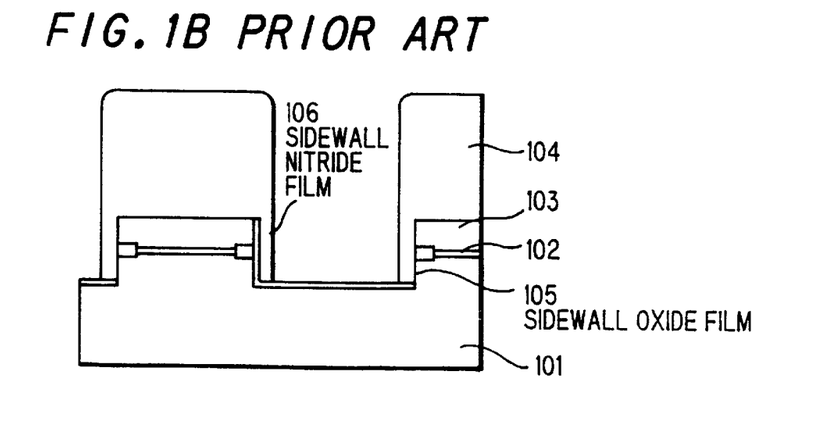

Then, as shown in FIG. 1B, the pad oxide film 102 is etched by about 30 nm, and then about 6 nm sidewall oxide film 105 and about 25 nm sidewall nitride film 106 are formed.

Figure 1C:
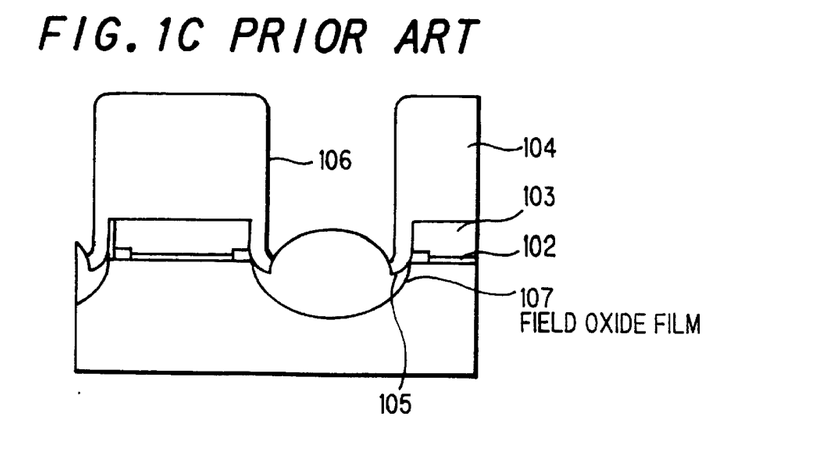

Then, as shown in FIG. 1C, field oxidation is conducted by about 350 nm to form field oxide film 107. In this case, the sidewall nitride film 106 suppresses the bird's beak encroachment, thereby enabling the device to have a finer device isolation width.

Next, a method for making a semiconductor device in the first preferred embodiment will be explained in FIGS. 2A to 2H.

In the first embodiment, the invention is applied to LOCOS process that device isolation is conducted by using polysilicon film as a buffer.

Figure 2A:
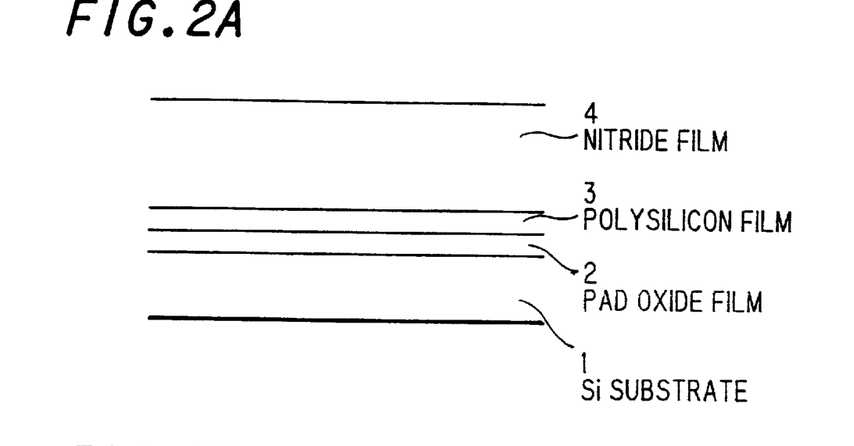
FIGS. 2A to 2H are cross sectional views showing a method for making a semiconductor device in a first preferred embodiment according to the invention.

At first, as shown in FIG. 2A, 5 nm thick pad oxide film 2, 10 nm thick polysilicon film 3 as a buffer and 200 nm thick nitride film 4 as anti-oxidation film are sequentially deposited on a silicon substrate 1.

Figure 2B:
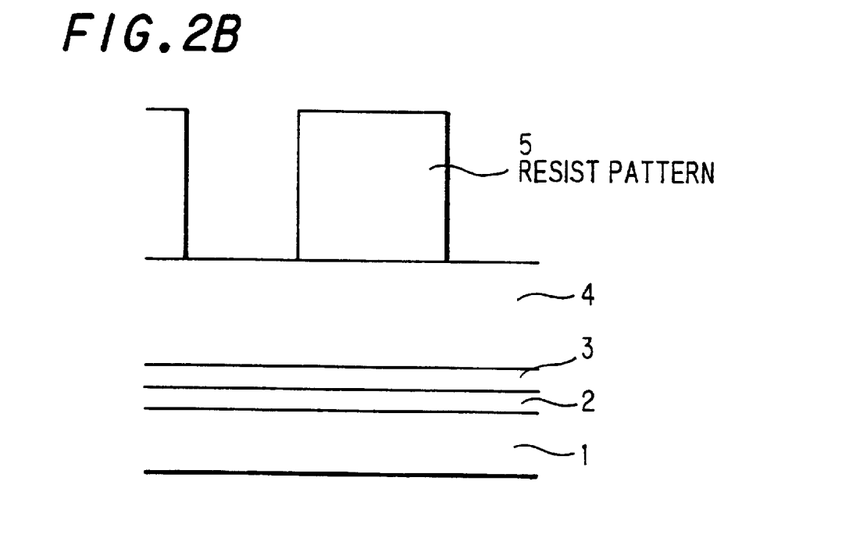

Next, as shown in FIG. 2B, a resist pattern 5 is formed on the nitride film 4 by using the known photolithography technique.

Figure 2C:
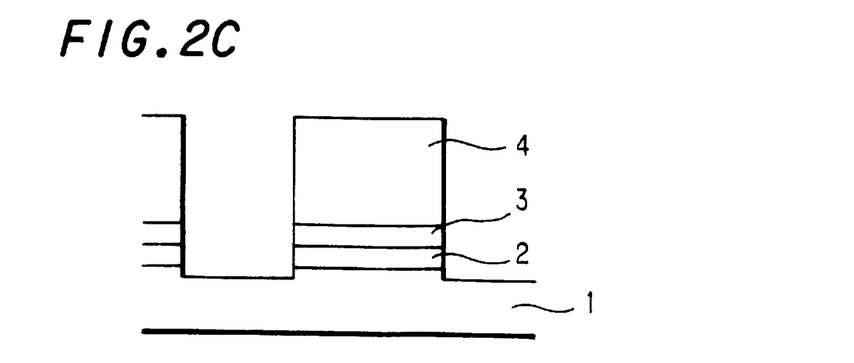

Then, as shown in FIG. 2C, the nitride film 4, polysilicon film 3 and pad oxide film 2 are etched by using the known etching technique with the resist pattern 5 as a mask. Simultaneously, part of the silicon substrate 1 is etched by about 30 nm, thereby giving a recessed surface to the silicon substrate 1. Then, the resist pattern 5 is removed.

Figure 2D:
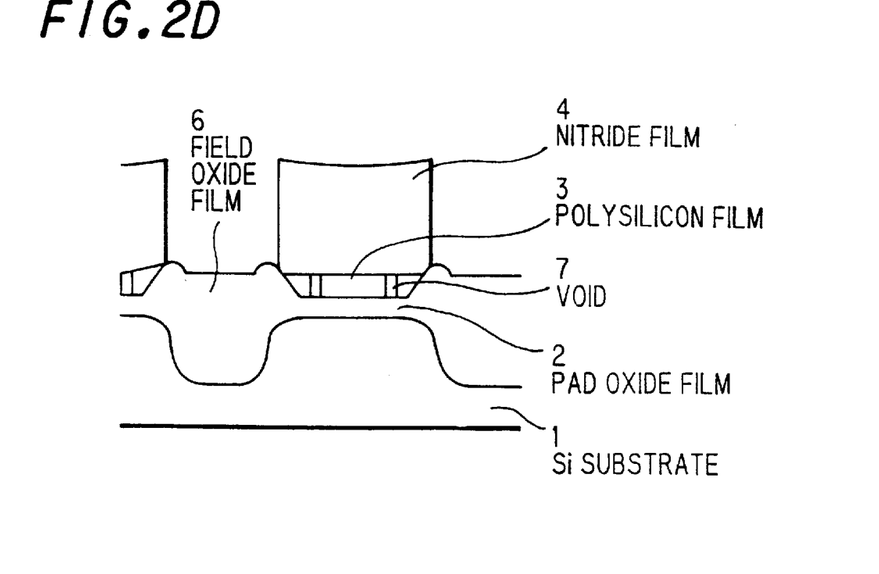

Then, as shown in FIG. 2D, the exposed silicon substrate 1 is oxidized by about 30 nm to form field oxide film 6 in the recessed region of the silicon substrate 1. At this time, a stress is generated against the bird's beak during the field oxidation, and thereby a void 7 occurs at part of the buffer polysilicon film 3.

Figure 2E:
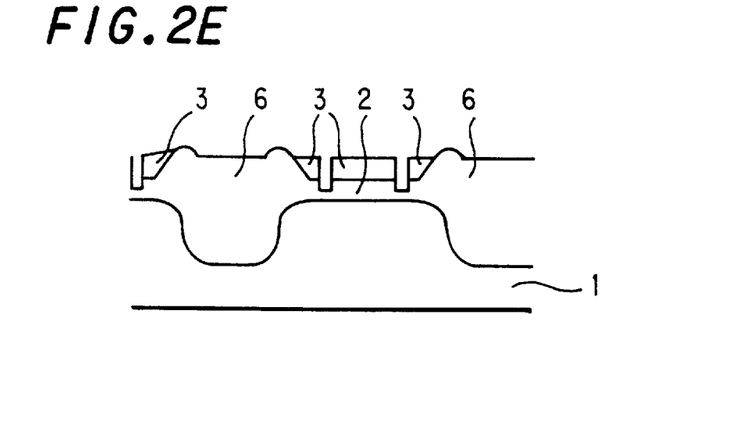

Then, as shown in FIG. 2E, the nitride film 4 is removed by using phosphoric acid. At this time, the buffer polysilicon film 3 remains not etched by phosphoric acid, but the pad oxide film 2 under the polysilicon film 3 is etched and the pad oxide film 2 under the void 7 generated in the polysilicon film 3 is all removed. In the worst case, part of the substrate 1 is exposed (not shown) penetrating through a cavity that is formed at where the pad oxide film 2 is removed.

Figure 2F:
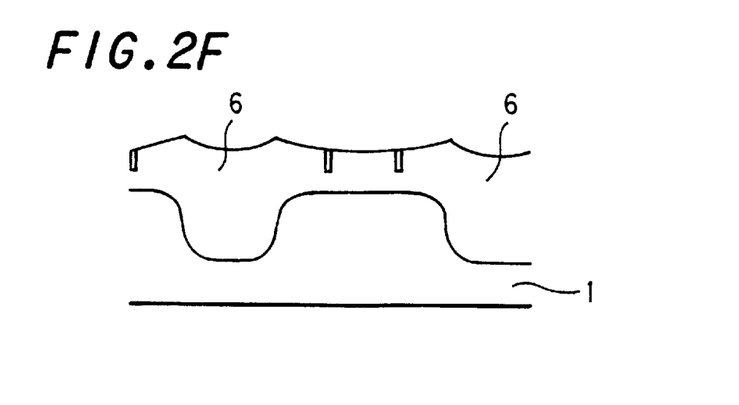

Then, as shown in FIG. 2F, the buffer polysilicon film 3 is oxidized to form silicon oxide film, and it is thus taken in the field oxide film 6 uniting with the field oxide film 6.

Figure 2G:
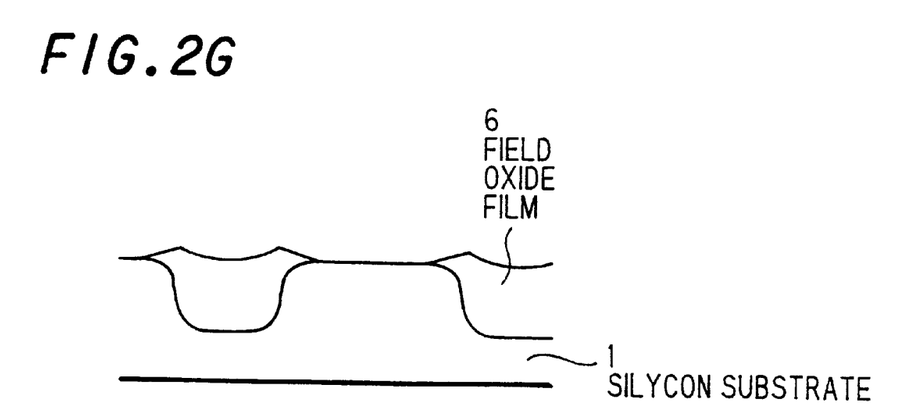

Then, as shown in FIG. 2G, part of the field oxide film 6 is removed by using hydrofluoric acid until the diffusion layer, which becomes a device region later, is exposed. At this time, the silicon substrate 1 is not etched by hydrofluoric acid at all, and therefore the base silicon substrate 1 is not etched and roughed. Thus, the device region and insulation region are formed on the silicon substrate 1.

Figure 2H:
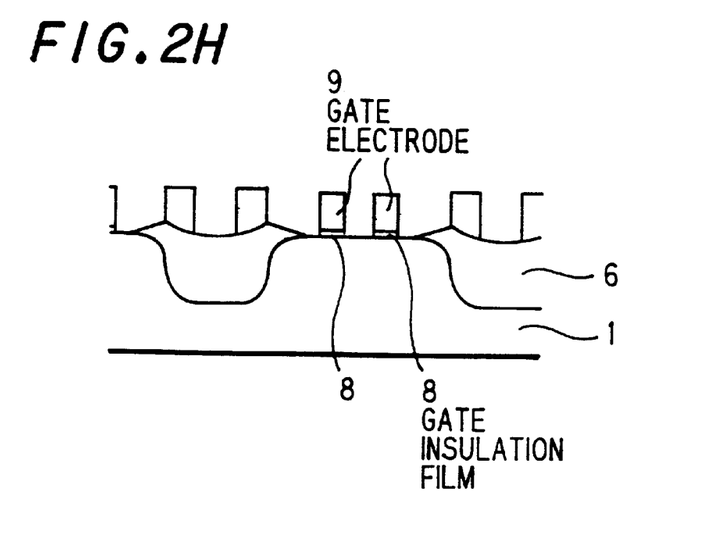

Then, as shown in FIG. 2H, gate insulation film 8 and a gate electrode 9 are formed on the device region of the silicon substrate 1 to form a transistor. Thus, the device regions of the silicon substrate 1 can be isolated by the field oxide film 6 and the transistor can be formed thereon, thereby obtaining a device with a high integration density. Thereafter, the device is completed by forming layer insulation film, contact, wiring etc.

Though, in the first embodiment, the thicknesses of the pad oxide film 2, buffer polysilicon film 3 and nitride film 4 are defined respectively, they are not limited and can be changed within a range where the buffer film after the field oxidation can be removed.

Also, in the first embodiment, the polysilicon film 3 is used as buffer film. However, the buffer film is not limited to polysilicon film and can be replaced by film with a buffer function, e.g., amorphous silicon film.

Also, in the first embodiment, the nitride film 4 is deposited on the polysilicon film 3. However, the anti-oxidation film is not limited to nitride film can be replaced by film with an anti-oxidation function against field oxidation, e.g., alumina film.

A method for making a semiconductor device in the second preferred embodiment will be explained in FIGS. 3A to 3G.

In the second embodiment, the invention is applied to LOCOS process that device isolation is conducted by using polysilicon film as a buffer.

Figure 3A:
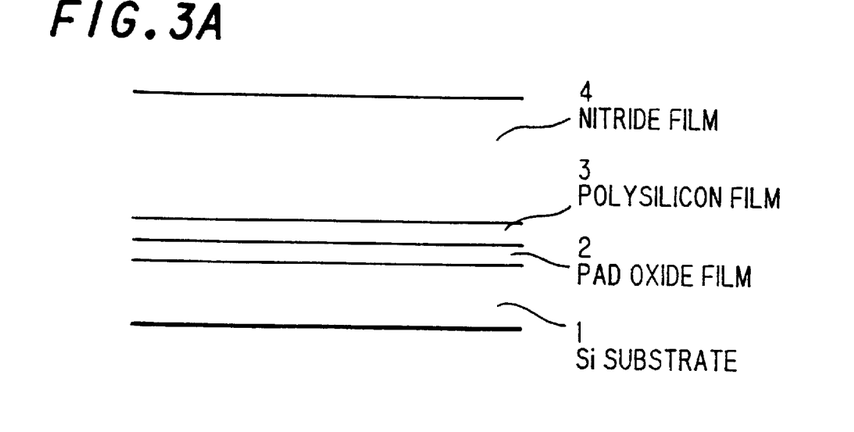
FIGS. 3A to 3G are cross sectional views showing a method for making a semiconductor device in a second preferred embodiment according to the invention.

At first, as shown in FIG. 3A, 15 nm thick pad oxide film 2, 20 nm thick polysilicon film 3 as a buffer and 200 nm thick nitride film 4 as anti-oxidation film are sequentially deposited on a silicon substrate 1, like the first embodiment.

Figure 3B:
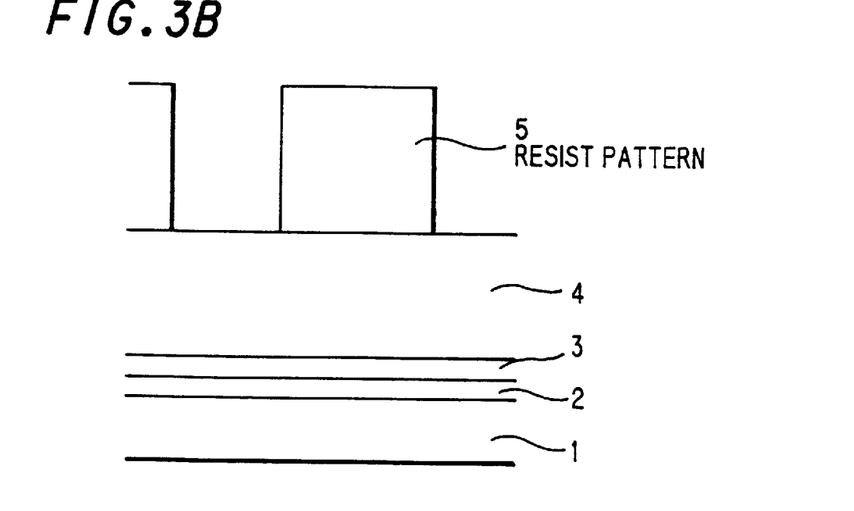

Next, as shown in FIG. 3B, a resist pattern 5 is formed on the nitride film 4 by using the known photolithography technique.

Figure 3C:
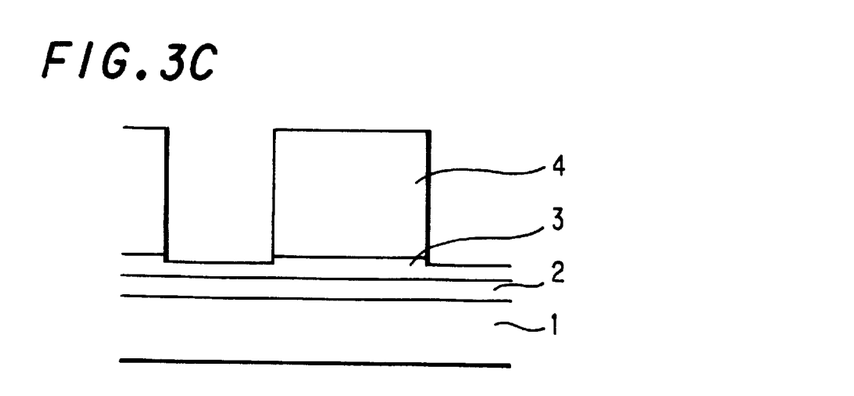

Then, as shown in FIG. 3C, the nitride film 4 is completely etched by using the known etching technique with the resist pattern 5 as a mask. Simultaneously, part of the polysilicon film 3 under the nitride film 4 is etched and then the resist pattern 5 is removed.

Figure 3D:
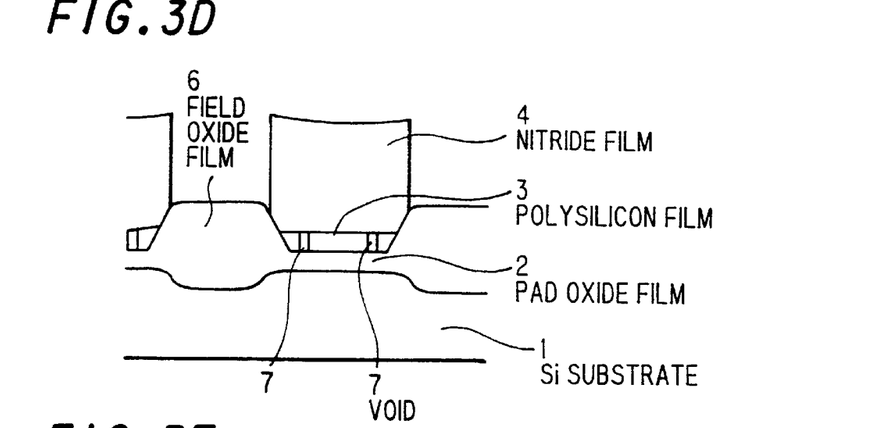

Then, as shown in FIG. 3D, the exposed silicon substrate 1 is oxidized to form field oxide film 6. At this time, like the first embodiment, a void 7 occurs at part of the buffer polysilicon film 3.

Figure 3E:
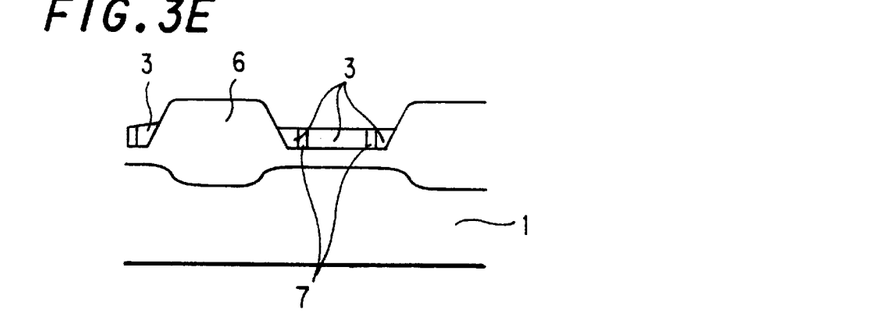

Then, as shown in FIG. 3E, the nitride film 4 is removed by using phosphoric acid. At this time, like the first embodiment, the etching at the void 7 is proceeded.

Figure 3F:
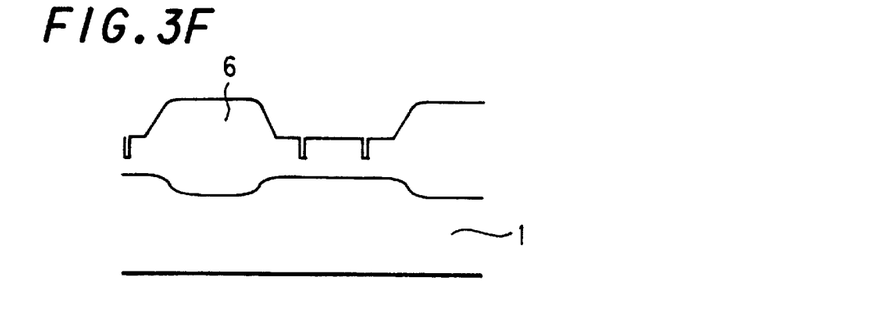

Then, as shown in FIG. 3F, the buffer polysilicon film 3 is oxidized to form silicon oxide film equal to the field oxide film 6.

Figure 3G:
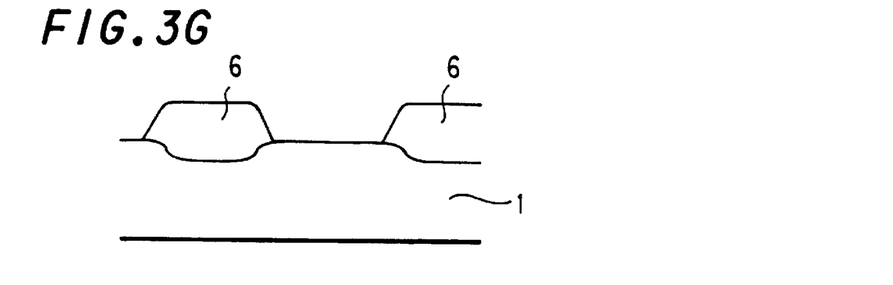

Then, as shown in FIG. 3G, part of the field oxide film 6 corresponding to where the diffusion layer is formed is removed by etching, thereby giving fine device isolation.

Though, in the second embodiment, the thicknesses of the pad oxide film 2, buffer polysilicon film 3 and nitride film 4 are defined respectively, they are not limited and can be changed within a range where the buffer film after the field oxidation can be removed.

A method for making a semiconductor device in the third preferred embodiment will be explained in FIGS. 4A to 4G.

In the third embodiment, the invention is applied to trench isolation process that can give a finer device isolation.

Figure 4A:
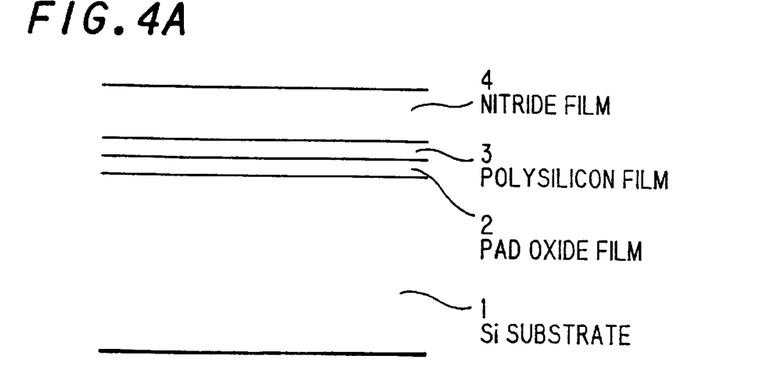
FIGS. 4A to 4G are cross sectional views showing a method for making a semiconductor device in a third preferred embodiment according to the invention.

At first, as shown in FIG. 4A, 5 nm thick pad oxide film 2, 10 nm thick polysilicon film 3 and 100 nm thick nitride film 4 are sequentially deposited on a silicon substrate 1.

Figure 4B:
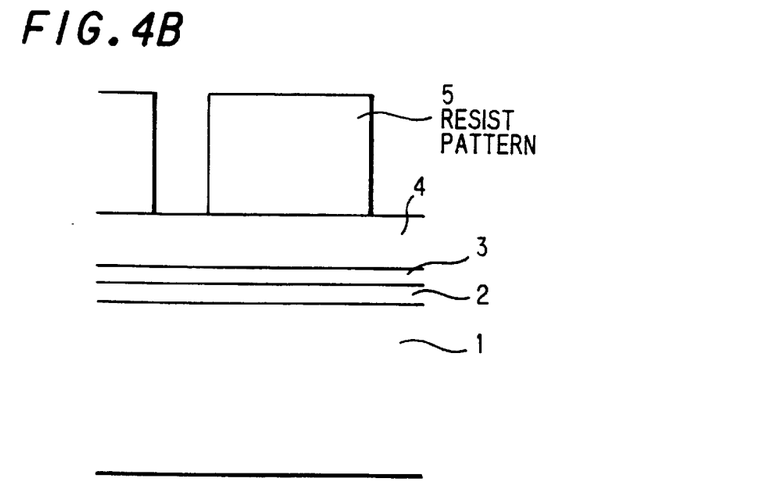

Next, as shown in FIG. 4B, a resist pattern 5 is formed on the nitride film 4 by using the known photolithography technique.

Figure 4C:
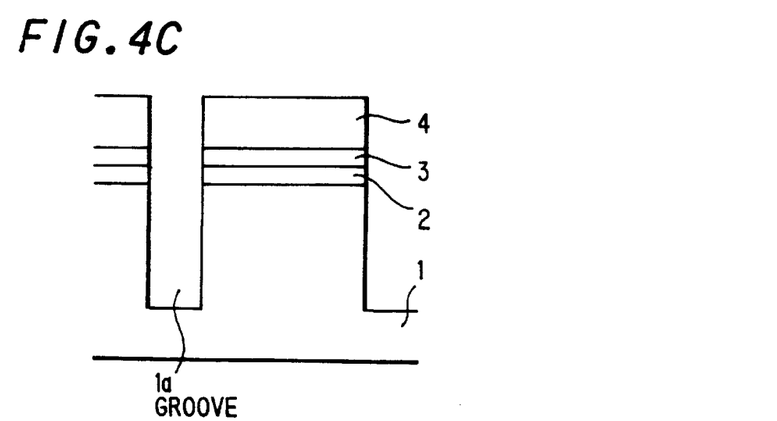

Then, as shown in FIG. 4C, the nitride film 4, polysilicon film 3, pad oxide film 2 and silicon substrate 1 are sequentially etched by using the known etching technique with the resist pattern 5 as a mask. In this case, the silicon substrate 1 is etched by about 300 nm to form a groove 1a that gives trench isolation. Then the resist pattern 5 is removed.

Figure 4D:
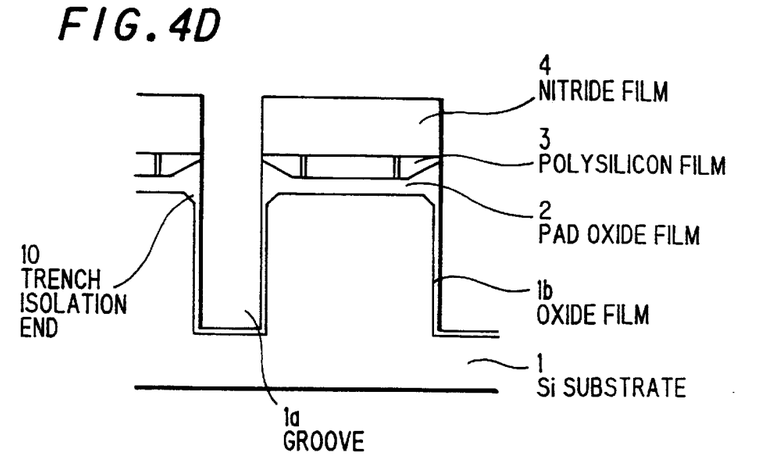

Then, as shown in FIG. 4D, the exposed silicon substrate 1 inside the groove 1a is oxidized by about 30 nm to form oxide film 1b. At this time, like the case of LOCOS device isolation process, the bird's beak encroachment occurs at a trench isolation end 10, and the oxide film 1a is thereby thickened at the trench isolation end 10. Thus, the trench isolation end is rounded. The rounded edge can improve the transistor property, thereby enhancing reliability.

Figure 4E:
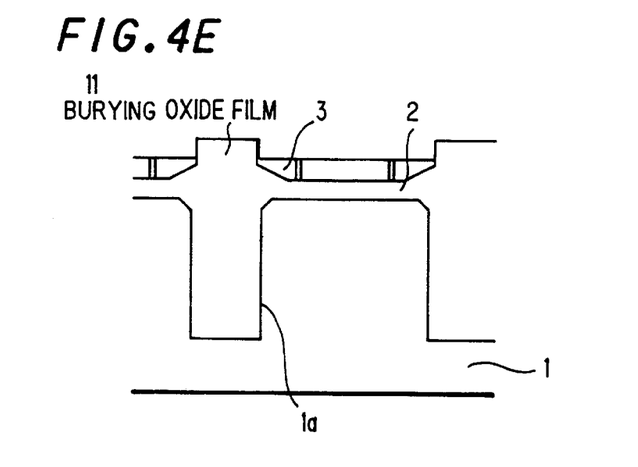

Then, as shown in FIG. 4E, burying oxide film 11 is buried in the trench groove 1a, and then the oxide film above the nitride film 4 is removed by using CMP process and then the nitride film 4 is removed by phosphoric acid.

Figure 4F:
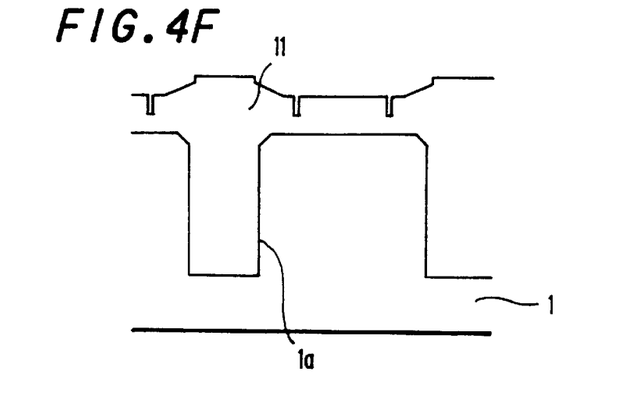

Then, as shown in FIG. 4F, the polysilicon film 3 is oxidized to form oxide film equal to the burying oxide film 11.

Figure 4G:
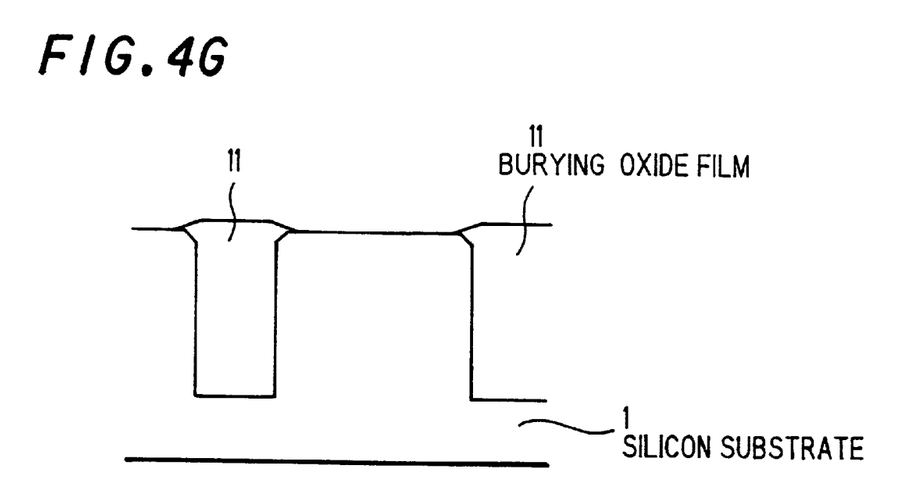

Then, as shown in FIG. 4G, the oxide film is etched until a diffusion layer is exposed. Thus, the silicon substrate with the diffusion layer including the trench isolation with the rounded edge can be formed.

Though, in the third embodiment, the thicknesses of the pad oxide film 2, buffer polysilicon film 3, nitride film 4 etc. are defined respectively, they are not limited and can be changed within a range where the buffer film can be removed.

Also, in the third embodiment, the nitride film 4 is used as an etching stopper during CMP process. However, the stopper is not limited to nitride film and can be replaced by, e.g., boron nitride film.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method of making a semiconductor device having at least one device region and at least one device isolation region for electrically isolating between device regions formed on a semiconductor substrate, said device region including a transistor, comprising the steps of:

forming a first oxide film on at least part of the semiconductor substrate;

forming a device isolation film disposed upon at least part of said first oxide film in the at least one device isolation region, using one of a patterned polysilicon film and amorphous silicon film as a buffer film in the at least one device region; and completely oxidizing said buffer film into a buffer silicon oxide film disposed upon said at least one device region and completely removing said buffer silicon oxide film after forming said device isolation film.

2. A method for making a semiconductor device where at least one device region and at least one device isolation region for electrically isolating between devices are formed on a semiconductor substrate, said at least one device region including a transistor, comprising the steps of:

forming sequentially a first oxide film, a polysilicon film and a silicon nitride film on said semiconductor substrate;

removing completely said silicon nitride film, said polysilicon film and said first oxide film in said at least one device isolation region by etching, and removing part of said semiconductor substrate in said at least one device isolation region by etching;

field-oxidizing said etched part of said semiconductor substrate to form a field oxide film;

removing a remaining portion of said silicon nitride film by etching; and oxidizing said polysilicon film to form a second oxide film disposed upon said at least one device region, and then completely removing said first and said second oxide film over said at least one device region.

3. A method for making a semiconductor device where at least one device region and at least one device isolation region for electrically isolating between devices are formed on a semiconductor substrate, said device region including a transistor, comprising the steps of:

forming sequentially a first oxide film, a polysilicon film and a silicon nitride film on said semiconductor substrate;

removing completely said silicon nitride film in said at least one device isolation region by etching, and removing part of said polysilicon film in said at least one device isolation region by etching;

field-oxidizing said isolation region to form a field oxide film;

completely removing a remaining portion of said silicon nitride by etching; and oxidizing said polysilicon film to form a second oxide film in said at least one device region, and then completely removing said first and said second oxide film over said at least one device region.

4. A method for making a semiconductor device where at least one device region and at least one device isolation region for electrically isolating between devices are formed on a semiconductor substrate, said device region including a transistor, comprising the steps of:

forming sequentially a first oxide film, a polysilicon film and a silicon nitride film on said semiconductor substrate;

removing completely said silicon nitride film, said polysilicon film and said first oxide film in said at least one device isolation region by etching;

removing part of said semiconductor substrate in said at least one device isolation region by etching so as to form a groove on said semiconductor substrate;

oxidizing a sidewall of said groove and part of said polysilicon film and burying said groove with a burying oxide film to form a field oxide film;

removing a remaining portion of said silicon nitride film by etching; and oxidizing said polysilicon film to form a second oxide film in said at least one device region and then removing said first and said second oxide film over said at least one device region.

5. The method for making a semiconductor device, according to claim 2, wherein:

said polysilicon film is replaced by an amorphous silicon film.

6. The method for making a semiconductor device, according to claim 3, wherein:

said polysilicon film is replaced by an amorphous silicon film.

7. The method for making a semiconductor device, according to claim 4, wherein:

said polysilicon film is replaced by an amorphous silicon film.

8. The method for making a semiconductor device, according to claim 2, wherein:

said silicon nitride film is replaced by an anti-oxidation film.

9. The method for making a semiconductor device, according to claim 3, wherein:

said silicon nitride film is replaced by an anti-oxidation film.

10. The method for making a semiconductor device, according to claim 4, wherein:

said silicon nitride film is replaced by an anti-oxidation film.

11. The method for making a semiconductor device, according to claim 4, wherein:

said silicon nitride film is replaced by a film with an etch selectively to oxide film.

12. A method of forming at least one device isolation region abutting at least one device region on a semiconductor substrate, comprising:

forming an oxidizable buffer film disposed upon a pad oxide film, having a first portion on the at least one device isolation region and having a second portion on the at least one device region;

forming a field oxide film in the at least one device isolation region; and causing at least a part of the second portion of the oxidizable buffer film to become part of the field oxide film.

13. A method, according to claim 12, further comprising:

forming an anti-oxidation film on the first and second portions of the buffer film.

14. A method, according to claim 13, further comprising:

prior to causing the buffer film to become part of the field oxide film, removing the anti-oxidation film.

15. A method, according to claim 13, wherein the anti-oxidation film is one of: a nitride film and an alumina film.

16. A method, according to claim 12, wherein the buffer film is one of: amorphous silicon and polysilicon.

17. A method, according to claim 16, wherein causing the buffer film to become part of the field oxide film includes oxidizing the buffer film.

18. A method, according to claim 12, wherein the first and second portions of the buffer film are formed by etching a section of the buffer film corresponding to the device isolation region.

19. A method, according to claim 18, further comprising:

prior to etching a section of the buffer film, forming an anti-oxidation film on the buffer film so that etching is performed on the anti-oxidation film as well as the section of the buffer film.

20. A method, according to claim 21, wherein after etching, part of the buffer film remains in the device isolation region.

21. The method, according to claim 19, wherein the buffer film is formed on the pad oxide film, and the pad oxide film is formed on the substrate.

22. A method, according to claim 21, wherein etching is performed on parts of the buffer film, the pad oxide film, and the substrate that corresponds to the device isolation region.

23. A method, according to claim 22, further comprising:

following oxidizing the device isolation region, providing a burying oxide film in a trench formed by etching the substrate.

24. A method of forming electrically separate device areas on a semiconductor substrate, comprising:

forming a buffer film on portions of the substrate corresponding to the device areas;

forming a field oxide film in a region between the device areas; and causing the buffer film in at least part of the device areas to become part of the field oxide film.

25. A method, according to claim 24, further comprising:

forming an anti-oxidation film on the buffer film.

26. A method, according to claim 25, further comprising:

prior to causing the buffer film to become part of the field oxide film, removing the anti-oxidation film.

27. A method, according to claim 24, wherein causing the buffer film to become part of the field oxide film includes oxidizing the buffer film.

28. A method, according to claim 24, further comprising:

selectively etching a section of the buffer film between the device areas.

29. A method, according to claim 28, further comprising:

prior to selectively etching, forming an anti-oxidation film on the buffer film so that etching is performed on the anti-oxidation film as well as the section of the buffer film.

30. A method, according to claim 29, wherein after etching, part of the buffer film remains between the device areas.

31. A method, according to claim 28, wherein etching is performed through the buffer film and on part of the substrate corresponding to the device isolation region.

32. A method, according to claim 31, further comprising:
following oxidizing a region between the device areas, providing a burying oxide film in a trench formed by etching the substrate.

* * * * *